US012590369B2

(12) United States Patent
Bajaj et al.

(10) Patent No.: US 12,590,369 B2
(45) Date of Patent: Mar. 31, 2026

(54) ATOMIC LAYER DEPOSITION USING NOVEL OXYGEN-CONTAINING PRECURSORS

(71) Applicant: Applied Materials, Inc., Santa Clara, CA (US)

(72) Inventors: Geetika Bajaj, Mumbai (IN); Amit Kumar Roy, Kolkata (IN); Shonal Chouksey, Rupnagar (IN); Seshadri Ganguli, San Jose, CA (US); Gopi Chandran Ramachandran, Mumbai (IN); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/208,695

(22) Filed: Jun. 12, 2023

(65) Prior Publication Data

US 2023/0416915 A1     Dec. 28, 2023

Related U.S. Application Data

(60) Provisional application No. 63/354,355, filed on Jun. 22, 2022.

(51) Int. Cl.
*C23C 16/455* (2006.01)
*H01L 21/02* (2006.01)
*H01L 21/285* (2006.01)

(52) U.S. Cl.
CPC .. *C23C 16/45553* (2013.01); *C23C 16/45529* (2013.01); *H01L 21/0228* (2013.01); *H01L 21/28562* (2013.01)

(58) Field of Classification Search
None
See application file for complete search history.

(56) References Cited

U.S. PATENT DOCUMENTS 6,203,613 B1 *   3/2001   Gates ............... H01L 21/02189
                                                       257/E21.271
2002/0087018 A1 *   7/2002   Celinska .............. C07C 53/126
                                                       427/255.35
(Continued)

FOREIGN PATENT DOCUMENTS

CN          111356785 A       6/2020
DE     102013109357 A1 *   3/2015   ........... G01N 27/414
(Continued)

OTHER PUBLICATIONS

Application No. PCT/US2023/024912 , International Search Report and the Written Opinion, Mailed On Oct. 4, 2023, 10 pages.
(Continued)

*Primary Examiner* — Alexander M Weddle
(74) *Attorney, Agent, or Firm* — Kilpatrick Townsend & Stockton LLP

(57) ABSTRACT

Exemplary methods of semiconductor processing may include providing a first precursor to a semiconductor processing chamber. A substrate may be disposed within a processing region of the semiconductor processing chamber. The first precursor may include a first metal. The methods may include contacting the substrate with the first precursor. The contacting may form a first portion of a metal oxide material on the substrate. The methods may include providing a second precursor to the semiconductor processing chamber. The second precursor may be an oxygen-containing precursor including an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate. The methods may include contacting the first portion of the metal oxide material with the second precursor. The contacting may form a metal oxide material.

20 Claims, 4 Drawing Sheets

(56) References Cited

U.S. PATENT DOCUMENTS

| | | | |
|---|---|---|---|
| 2014/0120738 A1 | 5/2014 | Jung et al. | |
| 2019/0157067 A1* | 5/2019 | Bhuyan ............... | C23C 16/0245 |
| 2019/0348273 A1* | 11/2019 | Tang ................. | H01L 21/02145 |
| 2021/0233769 A1 | 7/2021 | Yamazaki et al. | |

FOREIGN PATENT DOCUMENTS

| | | | |
|---|---|---|---|
| KR | 100685748 B1 | 2/2007 |
| TW | 201218473 A | 5/2012 |
| TW | 201725278 A | 7/2017 |
| TW | 201947059 A | 12/2019 |

OTHER PUBLICATIONS

Office Action for TW112122160 mailed Feb. 26, 2024, 13 pages.
Office Action for TW112122160 mailed Aug. 1, 2024, 6 pages.
TW112122160, "Office Action", Apr. 24, 2025, 11 pages.
Taiwanese Application No. 112122160, Notice of Decision to Grant
mailed on Sep. 19, 2025, 4 pages (2 pages of English Translation
and 2 pages of original documents).

* cited by examiner

300

310

305

315

305

ATOMIC LAYER DEPOSITION USING NOVEL OXYGEN-CONTAINING PRECURSORS

CROSS-REFERENCE TO RELATED APPLICATIONS

This application claims the benefit of, and priority to U.S. Provisional Application Ser. No. 63/354,355, filed Jun. 22, 2022, which is hereby incorporated by reference in its entirety for all purposes.

TECHNICAL FIELD

The present technology relates to systems and methods for semiconductor processing. More specifically, the present technology relates to systems and methods for forming materials on semiconductor structures.

BACKGROUND

Integrated circuits are made possible by processes which produce intricately patterned material layers on substrate surfaces. Producing patterned material on a substrate requires controlled methods for forming and removing material. As device sizes continue to reduce, and device complexity continues to increase, producing structures has become increasingly complex. Developing structures may take many more operations to produce the complex patterning and material integration. Additionally, as the number of material layers being patterned during processing is expanding, producing materials that may have improved removal selectivity to other exposed materials is becoming a greater challenge, along with maintaining material properties.

Thus, there is a need for improved systems and methods that can be used to produce high quality devices and structures. These and other needs are addressed by the present technology.

SUMMARY

Exemplary methods of semiconductor processing may include providing a first precursor to a semiconductor processing chamber. A substrate may be disposed within a processing region of the semiconductor processing chamber. The first precursor may include a first metal. The methods may include contacting the substrate with the first precursor. The contacting may form a first portion of a metal oxide material on the substrate. The methods may include providing a second precursor to the semiconductor processing chamber. The second precursor may be an oxygen-containing precursor including an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate. The methods may include contacting the first portion of a metal oxide material with the second precursor. The contacting may form a metal oxide material on the substrate.

In some embodiments, the first metal may be or include a metal halide, a metal alkyl, a metal ethoxide, a metal sulfide, a metal cyclopentadienyl, a metal amide, a metal phosphine, a metal amine, a metal hydride, a metal carboxylate, a metal hydrazide, or a metal azide. The second precursor may include a second metal. The second metal may be a different metal than the first metal. The metal oxide material may include two or more metals. The oxygen-containing precursor may not include water, steam, ozone, molecular oxygen, oxygen-containing plasma, or hydrogen peroxide. The metal oxide material may be characterized by a dielectric constant of greater than or about 3. The methods may include halting a flow of the first precursor while providing the second precursor. The metal oxide material may be a first metal oxide material. The oxygen-containing precursor may be or include a first oxygen-containing precursor. The methods may include, subsequent to forming the metal oxide material to a first thickness, providing a third precursor to the semiconductor processing chamber. The methods may include contacting the first metal oxide material with the third precursor. The contacting may form a first portion of a second metal oxide material on the first metal oxide material. The methods may include providing a fourth precursor to the semiconductor processing chamber. The fourth precursor may be or include a second oxygen-containing precursor. The methods may include contacting the first portion of the second metal oxide material with the fourth precursor. The contacting may form a second metal oxide material on the first metal oxide material. The fourth precursor may be or include water, steam, ozone, molecular oxygen, oxygen-containing plasma, or hydrogen peroxide.

Some embodiments of the present disclosure encompass semiconductor processing methods. The methods may include i) providing a first precursor. The first precursor may include a first metal. The methods may include ii) forming a first portion of a metal oxide material on a substrate. The methods may include iii) providing a second precursor. The second precursor may include a second metal. The methods may include iv) contacting the first portion of the metal oxide material with the second precursor. The first precursor, the second precursor, or both may include oxygen. The contacting may form a metal oxide material.

In some embodiments, operations i) through iv) are repeated for at least 2 cycles. The metal oxide material may be doped with one or more of aluminum, barium, calcium, hafnium, potassium, tantalum, titanium, sodium, strontium, zinc, or zirconium. The methods may include annealing the metal oxide material. The annealing may cause amorphous metal oxide to crystallize. The metal oxide material may be a first metal oxide material. The methods may include v) providing a third precursor. The third precursor may include a third metal. The methods may include vi) forming a first portion of a second metal oxide material on the first metal oxide material. The methods may include vii) providing a fourth precursor. The fourth precursor may include a fourth metal. The methods may include viii) contacting the first portion of the second metal oxide material with the fourth precursor. The third precursor, the fourth precursor, or both may include oxygen. The contacting may form a second metal oxide material. The first precursor, the second precursor, or both may be or include a first oxygen-containing material. The third precursor, the fourth precursor, or both may be or include a second oxygen-containing material different than the first oxygen-containing material. The first precursor, the second precursor, or both be or include an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate. The metal oxide material may directly contact the substrate.

Some embodiments of the present disclosure encompass semiconductor processing methods. The methods may include providing a first precursor to a semiconductor processing chamber, wherein a substrate is disposed within a processing region of the semiconductor processing chamber.

The first precursor may include a first metal. The methods may include contacting the substrate with the first precursor. The contacting may form a first portion of a metal oxide material on the substrate. The methods may include halting a flow of the first precursor. The methods may include providing a second precursor to a semiconductor processing chamber. The second precursor may include a second metal. The methods may include contacting the first portion of the metal oxide material with the second precursor. The first precursor or the second precursor may be or include an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate. The contacting may form a metal oxide material on the substrate. The metal oxide material may directly contact the substrate. The metal oxide material may be characterized by a dielectric constant of greater than or about 3.

In some embodiments, no interfacial layer may be formed between the substrate and the metal oxide material. The metal oxide material may include a plurality of metals.

Such technology may provide numerous benefits over conventional systems and techniques. For example, embodiments of the present technology may produce materials developed through atomic layer deposition that do not have interfacial layers, which may allow for desirable properties in the final materials and/or structures. Additionally, the present technology may produce materials by selectively switching oxygen-containing precursor, which may provide for increased electrical properties of the material (e.g., dielectric constant and/or leakage current). These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
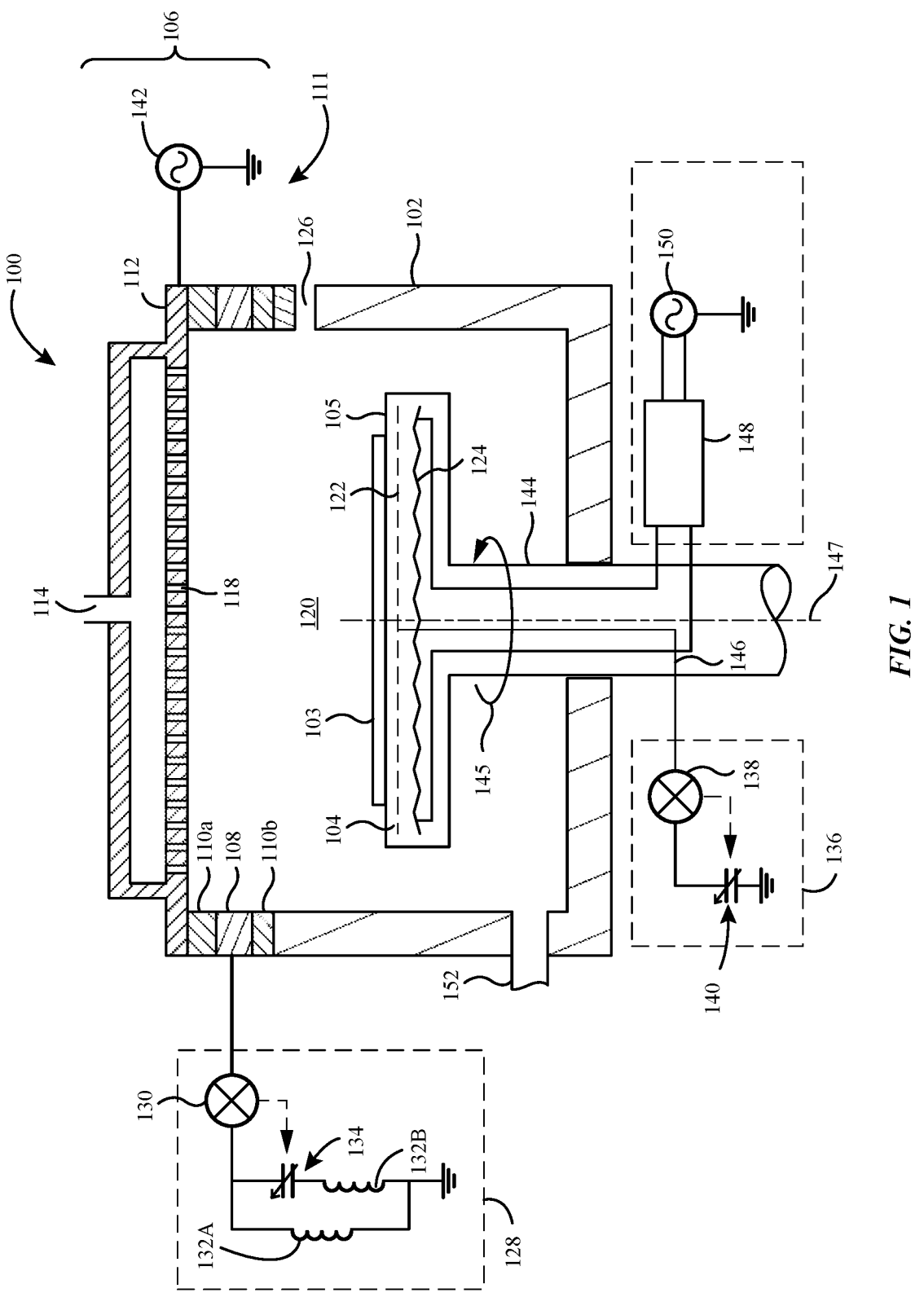
FIG. 1 shows a schematic cross-sectional view of an exemplary plasma system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As device sizes continue to shrink, many material layers may be reduced in thickness and size to scale devices.

Forming materials on some substrates or other materials, if present, may result in the undesirable formation of interfacial layers. Additionally, as the number of materials on a surface to be processed may increase, newer materials may be utilized to increase device performance.

Conventional atomic layer deposition technologies have struggled to deposit oxygen-containing films without the presence of interfacial layers. The conventionally used oxygen precursors necessary to form oxygen-containing films may oxidize the substrate or other material, resulting in the formation of interfacial layers. The conventionally used oxygen precursors may provide desirable electrical characteristics to the material and device formed. For example, conventionally used oxygen-containing precursors such as water, steam, ozone, molecular oxygen, oxygen-containing plasma, or hydrogen peroxide may provide desirable dielectric properties and leakage currents, but may suffer from the formation of these interfacial layers. As device sizes continue to shrink and individual layers become thinner, the presence of interfacial layers may greatly impact final structures. Accordingly, many conventional technologies have been limited in the ability to produce atomic layer deposition materials that are thin enough for modern applications due to the presence of interfacial layers.

The present technology overcomes these issues by performing atomic layer deposition using oxygen-containing precursors outside conventional oxygen-containing precursors. Unlike conventional technologies, the presently disclosed materials and techniques may facilitate formation of metal oxide material via atomic layer deposition using an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate that does not form interfacial layers during deposition and formation of the material. Additionally, the present materials may be able to incorporate multiple metals during the deposition, as well as multiple oxygen-containing precursors, to finely tune properties of the material as desired.

Although the remaining disclosure will routinely identify specific deposition processes utilizing the disclosed technology, and will describe one type of semiconductor processing chamber, it will be readily understood that the processes described may be performed in any number of semiconductor processing chambers. Additionally, the present technology may be applicable to any number of semiconductor processes, beyond the exemplary process described below. For example, the present technology may facilitate processes including selective deposition at back end of line, self-aligned via formation, and any number of additional processes in which blocking materials may be used to facilitate deposition on some exposed surfaces and not others. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 shows a cross-sectional view of an exemplary processing chamber 100 according to some embodiments of the present technology. The figure may illustrate an overview of a system incorporating one or more aspects of the present technology, and/or which may be specifically configured to perform one or more operations according to embodiments of the present technology. Additional details of chamber 100 or methods performed may be described further below. Chamber 100 may be utilized to form film layers according to some embodiments of the present technology, although it is to be understood that the methods may similarly be performed in any chamber within which film formation may occur. The processing chamber 100 may include a chamber body 102, a substrate support 104 disposed inside the chamber body 102, and a lid assembly 106 coupled with the chamber body 102 and enclosing the substrate support 104 in a processing volume 120. A substrate 103 may be provided to the processing volume 120 through an opening 126, which may be conventionally sealed for processing using a slit valve or door. The substrate 103 may be seated on a surface 105 of the substrate support during processing. The substrate support 104 may be rotatable, as indicated by the arrow 145, along an axis 147, where a shaft 144 of the substrate support 104 may be located. Alternatively, the substrate support 104 may be lifted up to rotate as necessary during a deposition process.

A plasma profile modulator 111 may be disposed in the processing chamber 100 to control plasma distribution across the substrate 103 disposed on the substrate support 104. The plasma profile modulator 111 may include a first electrode 108 that may be disposed adjacent to the chamber body 102, and may separate the chamber body 102 from other components of the lid assembly 106. The first electrode 108 may be part of the lid assembly 106, or may be a separate sidewall electrode. The first electrode 108 may be an annular or ring-like member, and may be a ring electrode. The first electrode 108 may be a continuous loop around a circumference of the processing chamber 100 surrounding the processing volume 120, or may be discontinuous at selected locations if desired. The first electrode 108 may also be a perforated electrode, such as a perforated ring or a mesh electrode, or may be a plate electrode, such as, for example, a secondary gas distributor.

One or more isolators 110a, 110b, which may be a dielectric material such as a ceramic or metal oxide, for example aluminum oxide and/or aluminum nitride, may contact the first electrode 108 and separate the first electrode 108 electrically and thermally from a gas distributor 112 and from the chamber body 102. The gas distributor 112 may define apertures 118 for distributing process precursors into the processing volume 120. The gas distributor 112 may be coupled with a first source of electric power 142, such as an RF generator, RF power source, DC power source, pulsed DC power source, pulsed RF power source, or any other power source that may be coupled with the processing chamber. In some embodiments, the first source of electric power 142 may be an RF power source.

The gas distributor 112 may be a conductive gas distributor or a non-conductive gas distributor. The gas distributor 112 may also be formed of conductive and non-conductive components. For example, a body of the gas distributor 112 may be conductive while a face plate of the gas distributor 112 may be non-conductive. The gas distributor 112 may be powered, such as by the first source of electric power 142 as shown in FIG. 1, or the gas distributor 112 may be coupled with ground in some embodiments.

The first electrode 108 may be coupled with a first tuning circuit 128 that may control a ground pathway of the processing chamber 100. The first tuning circuit 128 may include a first electronic sensor 130 and a first electronic controller 134. The first electronic controller 134 may be or include a variable capacitor or other circuit elements. The first tuning circuit 128 may be or include one or more inductors 132. The first tuning circuit 128 may be any circuit that enables variable or controllable impedance under the plasma conditions present in the processing volume 120 during processing. In some embodiments as shown, the first tuning circuit 128 may include a first circuit leg and a second circuit leg coupled in parallel between ground and the first electronic sensor 130. The first circuit leg may include a first inductor 132A. The second circuit leg may include a second inductor 132B coupled in series with the first electronic controller 134. The second inductor 132B may be disposed between the first electronic controller 134 and a node connecting both the first and second circuit legs to the first electronic sensor 130. The first electronic sensor 130 may be a voltage or current sensor and may be coupled with the first electronic controller 134, which may afford a degree of closed-loop control of plasma conditions inside the processing volume 120.

A second electrode 122 may be coupled with the substrate support 104. The second electrode 122 may be embedded within the substrate support 104 or coupled with a surface of the substrate support 104. The second electrode 122 may be a plate, a perforated plate, a mesh, a wire screen, or any other distributed arrangement of conductive elements. The second electrode 122 may be a tuning electrode, and may be coupled with a second tuning circuit 136 by a conduit 146, for example a cable having a selected resistance, such as 50 ohms, for example, disposed in the shaft 144 of the substrate support 104. The second tuning circuit 136 may have a second electronic sensor 138 and a second electronic controller 140, which may be a second variable capacitor. The second electronic sensor 138 may be a voltage or current sensor, and may be coupled with the second electronic controller 140 to provide further control over plasma conditions in the processing volume 120.

A third electrode 124, which may be a bias electrode and/or an electrostatic chucking electrode, may be coupled with the substrate support 104. The third electrode may be coupled with a second source of electric power 150 through a filter 148, which may be an impedance matching circuit. The second source of electric power 150 may be DC power, pulsed DC power, RF bias power, a pulsed RF source or bias power, or a combination of these or other power sources. In some embodiments, the second source of electric power 150 may be an RF bias power. The substrate support 104 may also include one or more heating elements configured to heat the substrate to a processing temperature, which may be between about 25° C. and about 800° C. or greater.

The lid assembly 106 and substrate support 104 of FIG. 1 may be used with any processing chamber for plasma or thermal processing. In operation, the processing chamber 100 may afford real-time control of plasma conditions in the processing volume 120. The substrate 103 may be disposed on the substrate support 104, and process gases may be flowed through the lid assembly 106 using an inlet 114 according to any desired flow plan. Gases may exit the processing chamber 100 through an outlet 152. Electric power may be coupled with the gas distributor 112 to establish a plasma in the processing volume 120. The substrate may be subjected to an electrical bias using the third electrode 124 in some embodiments.

Upon energizing a plasma in the processing volume 120, a potential difference may be established between the plasma and the first electrode 108. A potential difference may also be established between the plasma and the second electrode 122. The electronic controllers 134, 140 may then be used to adjust the flow properties of the ground paths represented by the two tuning circuits 128 and 136. A set point may be delivered to the first tuning circuit 128 and the second tuning circuit 136 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 128, 136 may have a variable impedance that may be adjusted using the respective electronic controllers 134, 140. Where the electronic controllers 134, 140 are variable capacitors, the capacitance range of each of the variable capacitors, and the inductances of the first inductor 132A and the second inductor 132B, may be chosen to provide an impedance range. This range may depend on the frequency and voltage characteristics of the plasma, which may have a minimum in the capacitance range of each variable capacitor. Hence, when the capacitance of the first electronic controller 134 is at a minimum or maximum, impedance of the first tuning circuit 128 may be high, resulting in a plasma shape that has a minimum aerial or lateral coverage over the substrate support. When the capacitance of the first electronic controller 134 approaches a value that minimizes the impedance of the first tuning circuit 128, the aerial coverage of the plasma may grow to a maximum, effectively covering the entire working area of the substrate support 104. As the capacitance of the first electronic controller 134 deviates from the minimum impedance setting, the plasma shape may shrink from the chamber walls and aerial coverage of the substrate support may decline. The second electronic controller 140 may have a similar effect, increasing and decreasing aerial coverage of the plasma over the substrate support as the capacitance of the second electronic controller 140 may be changed.

The electronic sensors 130, 138 may be used to tune the respective circuits 128, 136 in a closed loop. A set point for current or voltage, depending on the type of sensor used, may be installed in each sensor, and the sensor may be provided with control software that determines an adjustment to each respective electronic controller 134, 140 to minimize deviation from the set point. Consequently, a plasma shape may be selected and dynamically controlled during processing. It is to be understood that, while the foregoing discussion is based on electronic controllers 134, 140, which may be variable capacitors, any electronic component with adjustable characteristic may be used to provide tuning circuits 128 and 136 with adjustable impedance.

Figure 2:
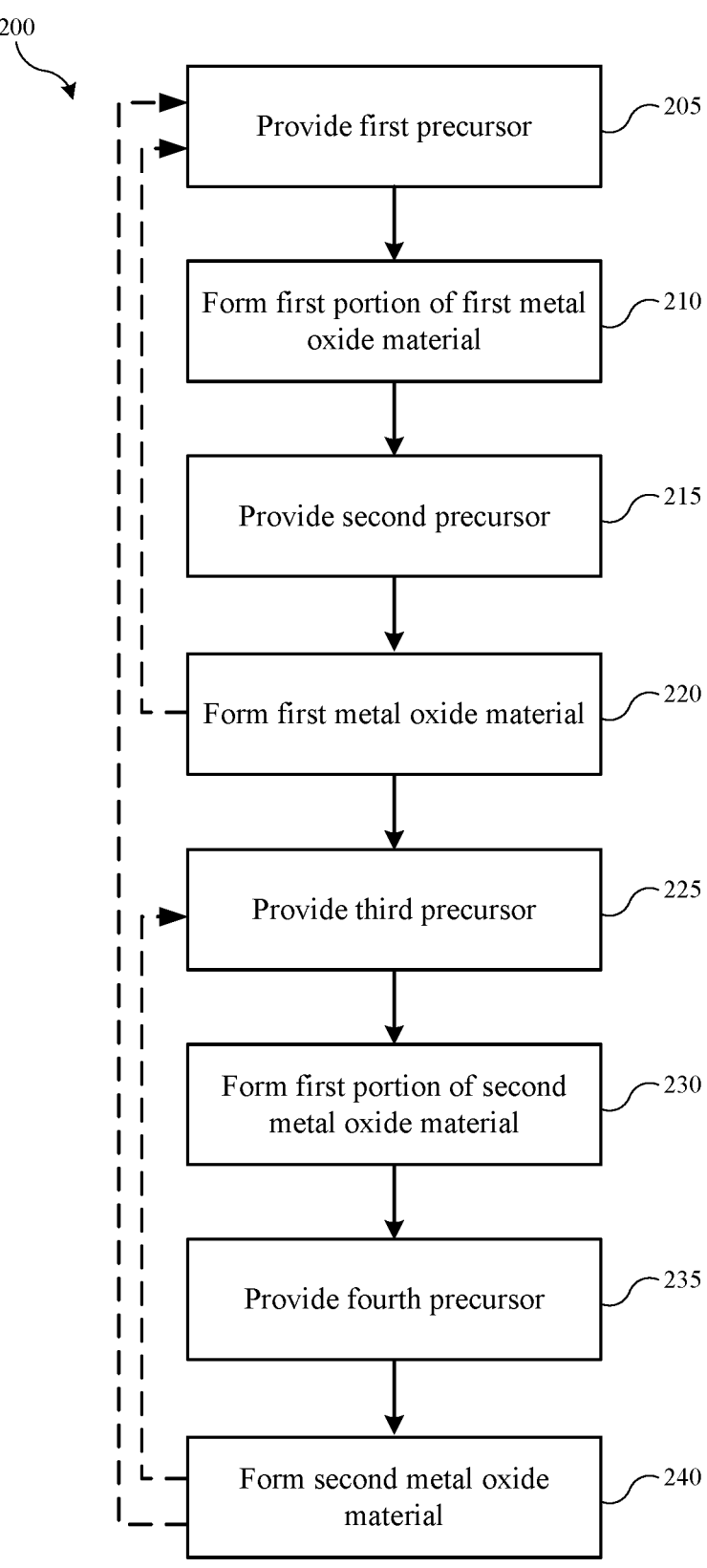
FIG. 2 shows operations in a semiconductor processing method according to some embodiments of the present technology.

Processing chamber 100 may be utilized in some embodiments of the present technology for processing methods that may include formation, etching, or conversion of materials for semiconductor structures. It is to be understood that the chamber described is not to be considered limiting, and any chamber that may be configured to perform operations as described may be similarly used. FIG. 2 shows exemplary operations in a processing method 200 according to some embodiments of the present technology. The method 200 may be performed in a variety of processing chambers and on one or more mainframes or tools, including processing chamber 100 described above. The method 200 may also be performed in a processing chamber suitable for liquid phase atomic layer deposition. Method 200 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 200 may describe operations shown schematically in FIGS. 3A-3D, the illustrations of which will be described in conjunction with the operations of method 200. It is to be understood that the figures illustrate only partial schematic views, and a substrate 305 may contain any number of additional materials and features having a variety of characteristics and aspects as shown in the figures.

The substrate 305 on which the material is formed may include a material in which one or more features may be formed. The substrate 305 may include any number of materials used in semiconductor processing. The substrate may be a wafer, thin film, particle(s), powder(s), or three-dimensional parts. In embodiments, the substrate material may be or include silicon, germanium, dielectric materials including silicon oxide or silicon nitride, metal materials, or any number of combinations of these materials. The substrate 305 may also include one or more substrate features formed in the substrate 305. The substrate features may be characterized by any shape or configuration according to the present technology. In some embodiments, the features may be or include a trench structure or aperture formed within the substrate.

Method 200 may include additional operations prior to initiation of the listed operations. For example, additional processing operations may include forming structures on a semiconductor substrate 305, which may include both forming and removing material. For example, transistor structures, memory structures, or any other structures may be formed. Prior processing operations may be performed in the chamber in which method 200 may be performed, or processing may be performed in one or more other processing chambers prior to delivering the substrate into the semiconductor processing chamber or chambers in which method 200 may be performed. Regardless, method 200 may optionally include delivering a semiconductor substrate 305 to a processing region of a semiconductor processing chamber, such as processing chamber 100 described above, or other chambers that may include components as described above. The substrate 305 may be deposited on a substrate support, which may be a pedestal such as substrate support 104, and which may reside in a processing region of the semiconductor processing chamber, such as a processing volume.

Embodiments of the present disclosure may form metal oxide materials through atomic layer deposition. The material may be formed by alternatively providing precursors such that the material intermittently forms. The precursors may include one or more metals, oxygen, or both. In embodiments, one of the precursors may include a metal and the other precursor may include oxygen with or without a metal. The precursor including oxygen may be referred to as an oxygen-containing precursor. The metal of the precursors may include, but is not limited to, a metal halide, a metal alkyl, a metal ethoxide, a metal sulfide, a metal cyclopentadienyl, a metal amide, a metal phosphine, a metal amine, a metal hydride, a metal carboxylate, a metal hydrazide, or a metal azide. The metal of the precursors may be, but is not limited to, Group 3A metals, transition metals, alkali metals, alkaline metals, noble metals, and other metals. For example, the metal of the precursors may be or include, but is not limited to, aluminum, gallium, iron, cobalt, nickel, niobium, tantalum, titanium, lithium, sodium, potassium, calcium, magnesium, silver, gold, iridium, zirconium, hafnium, scandium, yttrium, lanthanides, and the like.

The oxygen-containing precursor may include, but is not limited to, an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate. The compounds of the oxygen-containing precursor may afford a metal oxide material to be formed that is in direct contact with the substrate 305 or the material the metal oxide material is to be deposited on. Conventional atomic layer deposition oxidants, such as water, steam, ozone, molecular oxygen, oxygen-containing plasma, or hydrogen peroxide, may oxidize the substrate or underlying layer and form an interfacial layer between the metal oxide material and the substrate or the material the metal oxide material is to be deposited on. Accordingly, the initial formation of the metal oxide material may use an oxygen-containing precursor that is free of water, steam, ozone, molecular oxygen, oxygen-containing plasma, or hydrogen peroxide.

Further, as previously discussed, the precursor may include both oxygen and a metal. When the precursor includes both oxygen and metal, the precursor may be or include, but is not limited to, a metal alkoxide, a metal hydroxide, a metal acetyleacetonate, a metal acetate, or a metal formate. In embodiments when the oxygen-containing precursor of the precursors also includes a metal, the metal may be the same metal as the other precursor, or the metal may be a different metal than the metal of the other precursor. Depending on the oxygen-containing precursor used, and whether the oxygen-containing precursor includes a metal, oxygen content in the material may be controlled. Accordingly, an oxygen-rich or oxygen-deficient film may be formed depending on the precursor used. In embodiments, different metals may be used in the various precursors to form materials that include a plurality of materials, such as mixed metal oxide materials. For example, the metal oxide material may include two, three, four, five, or more metals. Mixed metal oxide materials may prevent or reduce the crystallization of films, allowing for high temperature stability and/or high dielectric constant applications.

Figure 3A:
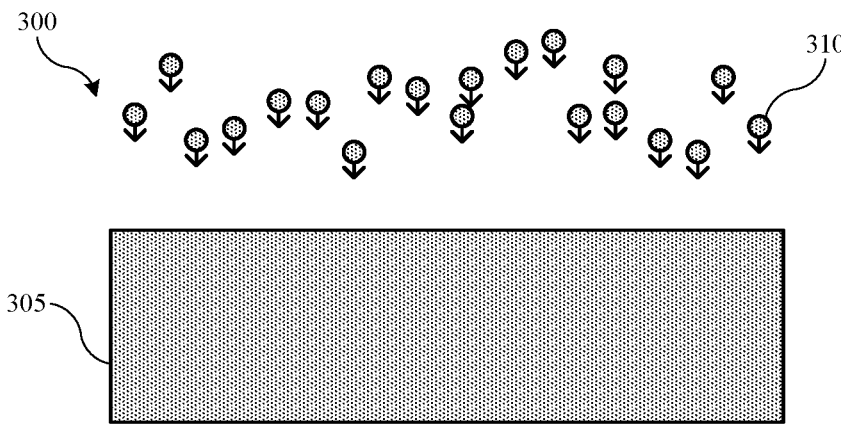
FIGS. 3A-3D show exemplary schematic cross-sectional structures in which material layers are included produced according to some embodiments of the present technology.
Figure 3B:
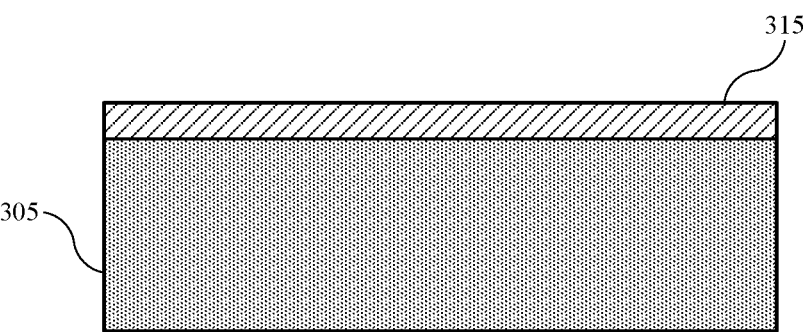

As shown in FIG. 3A, the method 200 may include providing a first precursor to a semiconductor processing chamber at operation 205. In embodiments, the method 200 may include generating a plasma of the first precursor prior to or after providing the first precursor to the semiconductor processing chamber. The first precursor may have at least one reactive group that can form a bond with a group attached to a surface of a substrate 305 in the substrate processing region. Molecules of the first precursor 310 may react with the surface groups to form bonds linking the first precursor molecule to the substrate surface. The reactions between molecules of the first precursor 310 and the groups on the substrate surface may continue until most or all the surface groups are bonded to a reactive group on molecules of the first precursor 310. As shown in FIG. 3B, a first portion of a metal oxide material 315 may be formed at operation 210. The formation of the first portion of the metal oxide material 315 may block further reaction between molecules of the first precursor 310 in the first precursor effluent and the substrate 305.

The formation rate of the first portion of the metal oxide material 315 may depend on the temperature of the substrate 305 as well as the temperature of the precursors that flow into the substrate processing region. Exemplary substrate temperatures during the formation operations may be greater than or about 50° C., greater than or about 60° C., greater than or about 70° C., greater than or about 80° C., greater than or about 90° C., greater than or about 100° C., greater than or about 110° C., greater than or about 120° C., greater than or about 130° C., greater than or about 140° C., greater than or about 150° C., or higher. By maintaining the substrate temperature elevated, such as above or about 100° C.

in some embodiments, an increased number of nucleation sites may be available along the substrate 305, which may improve formation and reduce void formation by improving coverage at each location.

The precursors may be delivered at any number of temperatures to effect increase ligand formation across the substrate 305 to improve initial formation and coverage across the substrate 305. The first precursor may be delivered at a temperature above or about 80° C., and may be delivered at a temperature greater than or about 90° C., greater than or about 100° C., greater than or about 110° C., or greater. By increasing the deposition of the first precursor, an increased number of deposit sites may be formed, which may more seamlessly grow material on the substrate 305. Additionally, this may allow the second precursor to be delivered at a temperature less than the first temperature. In some embodiments the reaction between the second precursor and the first precursor may occur more readily than a reaction between the first precursor and the substrate 305, and thus delivering the first precursor at an elevated temperature may ensure adequate formation across the substrate 305. The second precursor may then react with reactive groups of the first precursor at reduced temperatures. For example, the second precursor may be delivered at a temperature less than or about 100° C., and may be delivered at a temperature less than or about 90° C., less than or about 80° C., less than or about 70° C., less than or about 60° C., less than or about 50° C., less than or about 40° C., or less.

The formation rate of the first portion of the metal oxide material 315 may also depend on the pressure of the first precursor effluent in the substrate processing region. Exemplary effluent pressures in the substrate processing region may range from about 1 mTorr to about 500 Torr. Additional exemplary ranges include 1 Torr to about 20 Torr, 1 Torr to 15 Torr, and 1 Torr to 12 Torr, among other exemplary ranges.

The first precursor effluent may remain in the substrate processing region for a period of time to nearly or completely form the first portion of the metal oxide material 315. The precursors may be delivered in alternating pulses to grow the material. In some embodiments, the pulse times of either or both of the first precursor and the second precursor may be greater than or about 0.5 seconds, greater than or about 1 second, greater than or about 2 seconds, greater than or about 3 seconds, greater than or about 4 seconds, greater than or about 5 seconds, greater than or about 10 seconds, greater than or about 20 seconds, greater than or about 40 seconds, greater than or about 60 seconds, greater than or about 80 seconds, greater than or about 100 seconds, or more. In some embodiments the first precursor may be pulsed for longer periods of time than the second precursor. Similar to temperature as noted above, by increasing the residence time of the first precursor, improved adhesion may be produced across the substrate 305. The second precursor may then more readily react with the ligands of the first precursor, and thus the second precursor may be pulsed for less time, which may improve throughput. For example, in some embodiments, the second precursor may be pulsed for less than or about 90% of the time the first precursor is pulsed. The second precursor may also be pulsed for less than or about 80% of the time the first precursor is pulsed, less than or about 70% of the time the first precursor is pulsed, less than or about 60% of the time the first precursor is pulsed, less than or about 50% of the time the first precursor is pulsed, less than or about 40% of the time the first precursor is pulsed, less than or about 30% of the time the first precursor is pulsed, or less.

Method 200 may also include an operation to purge or remove the first precursor effluents from the substrate processing region following the formation of the first portion of the metal oxide material 315. The method 200 may include halting a flow of the first precursor prior to purging effluents of the first precursor. The effluents of the first precursor may be removed by pumping them out of the substrate processing region for a period of time ranging from about 10 seconds to about 100 seconds. Additional exemplary time ranges may include about 20 seconds to about 50 seconds, and 25 seconds to about 45 seconds, among other exemplary time ranges. However, in some embodiments, increased purge time may begin to remove reactive sites, which may reduce uniform formation. Accordingly, in some embodiments the purge may be performed for less than or about 60 seconds, and may be performed for less than or about 50 seconds, less than or about 40 seconds, less than or about 30 seconds, or less. In some embodiments, a purge gas may be introduced to the substrate processing region to assist in the removal of the effluents. Exemplary purge gases include helium and nitrogen, among other purge gases.

Figure 3C:
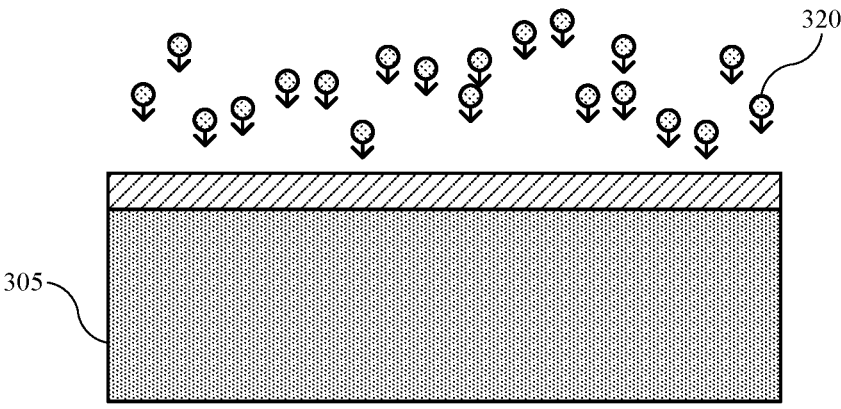
Figure 3D:
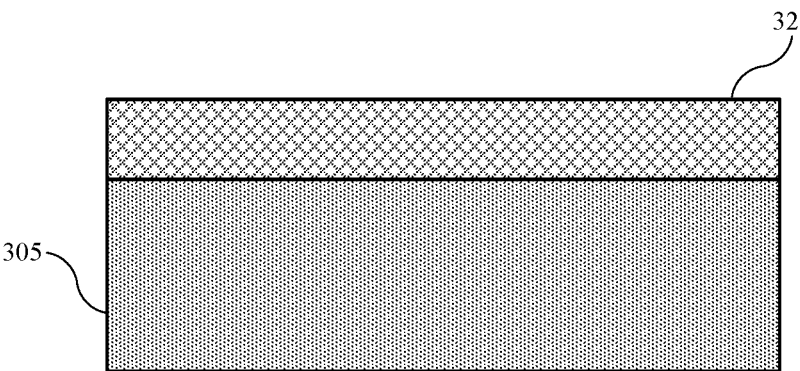

After the removal of the first precursor effluents, the second precursor may be provided to the semiconductor processing chamber at operation 215 as shown in FIG. 3C. In embodiments, the method 200 may include generating a plasma of the second precursor prior to or after providing the second precursor to the semiconductor processing chamber. The second precursor may have at least one reactive group that can form bonds with unreacted reactive groups of the first precursor that formed the first portion of the metal oxide material 315. Molecules of the second precursor 320 may react with the unreacted reactive groups of the first precursor to form bonds linking molecules of the second precursor 320 to molecules of the first precursor 310. The reactions between molecules of the second precursor 320 and molecules of the first precursor 310 may continue until most or all the unreacted reactive groups on molecules of the first precursor 310 have reacted with molecules of the second precursor 320. As shown in FIG. 3D, the contact between the second precursor and the first portion of the first metal oxide material 315 may form a metal oxide material 325 at operation 220. The formation of the metal oxide material 325 may block further reaction between molecules of the second precursor 320 in the second precursor effluent and the first portion of the metal oxide material 315. The first precursor, the second precursor, or both may include oxygen, such that the metal oxide material 325 may include oxygen. Accordingly, the effluents of the second precursor, together with the first portion of the metal oxide material 315, may form a metal oxide material 325. For example, the first precursor may include a first metal and the second precursor may include oxygen, with or without a second metal. The first precursor may form a layer of metal, and the second precursor may contact the layer of metal, forming the metal oxide material 325.

The formation rate of the metal oxide material 325 may also depend on the pressure of the second precursor effluent in the substrate processing region. Exemplary effluent pressures in the substrate processing region may range from about 1 Torr to about 20 Torr. Additional exemplary ranges include 1 Torr to 15 Torr, and 1 Torr to 12 Torr, among other exemplary ranges.

Method 200 also includes an operation to purge or remove the second precursor effluents from the substrate processing region following the formation of the metal oxide material 325. The method 200 may include halting a flow of the second precursor prior to pursing the effluents of the second precursor. The effluents of the second precursor may be removed by pumping them out of the substrate processing region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include helium and nitrogen, among other purge gases.

In embodiments, there may be a determination of whether a target thickness of as-deposited material on the substrate 305 has been achieved following one or more cycles of forming a metal oxide material 325. If a target thickness of as-deposited material has not been achieved, another cycle of providing the first precursor and second precursor may be performed. If a target thickness of as-deposited material has been achieved, another cycle of providing the first precursor and second precursor may not be started. Exemplary numbers of cycles for the formation of metal oxide materials 325 may include 1 cycle, or may include greater than 2 cycles, 5 cycles, 10 cycles, 25 cycles, 50 cycles, 100 cycles, or more. Additional exemplary ranges for the number of cycles may include 50 cycles to 2000 cycles, 50 cycles to 1000 cycles, and 100 cycles to 750 cycles, among other exemplary ranges. Exemplary ranges of target thickness to discontinue further cycles of forming metal oxide material 325 include about 1 Å to about 500 Å. Additional exemplary thickness ranges may include about 2 Å to about 300 Å, and 3 Å to about 200 Å, among other exemplary thickness ranges.

In embodiments, the metal oxide material 325 may be alloyed or doped with one or more materials. For example, by selecting the precursors provided to form the metal oxide material 325, the material may be alloyed doped with one or more of aluminum, barium, calcium, hafnium, potassium, tantalum, titanium, sodium, strontium, zinc, or zirconium. The alloy or dopant materials may be selected to modify characteristics depending on the final application of the material. For example, by selecting precursors and dopants, the metal oxide material may be an $AlZnO_x$ or $AlTiO_x$ material, although any other metal oxide material (e.g., mixed, stacked, or doped metal oxide material) is contemplated. Similar to mixed metal oxide materials as previously discussed, doping may prevent or reduce the crystallization of films, allowing for high temperature stability and/or high dielectric constant applications.

As previously discussed, the formation of a metal oxide material 325 using a conventional oxygen-containing precursor that includes water, steam, ozone, molecular oxygen, oxygen-containing plasma, or hydrogen peroxide may result in the formation of a material that has an interfacial layer and, therefore, does not directly contact the substrate 305 or underlying material, if present. However, conventional oxygen-containing precursors, such as water, steam, ozone, molecular oxygen, oxygen-containing plasma, or hydrogen peroxide, offer desirable benefits in formed materials, including desirable dielectric properties and low leakage currents.

In embodiments, the method 200 may include tuning the precursors subsequent to forming an initial portion of the metal oxide material 325 in order to impart desirable properties to the material. That is, subsequent to forming the metal oxide material 325 at operation 220, a third precursor and a fourth precursor may be provided to form a second metal oxide material with different properties from the metal oxide material 325 previously discussed, which may be a first metal oxide material 325. The third and fourth precursors may have any of the features or characteristics of the first precursor and second precursor. However, the oxygen-containing precursor of the third precursor and fourth precursor may include water, steam, ozone, molecular oxygen, oxygen-containing plasma, or hydrogen peroxide. As previously discussed, water, steam, ozone, molecular oxygen, oxygen-containing plasma, or hydrogen peroxide may oxidize the substrate 305 or underlying material and, therefore, form an interfacial layer. Simultaneously, water, steam, ozone, molecular oxygen, oxygen-containing plasma, or hydrogen peroxide may also provide desirable dielectric properties and low leakage currents. Therefore, the oxygen-containing precursor used after forming the first metal oxide material 325, whether the third precursor or the fourth precursor, may be or include water, steam, ozone, molecular oxygen, oxygen-containing plasma, or hydrogen peroxide. The formation of the second metal oxide material may be performed at operation conditions the same as or similar to those already discussed with regard to the formation of the first metal oxide material.

For example, the method 200 may include, after the removal of the second precursor effluents, providing a third to the semiconductor processing chamber at operation 225. In embodiments, the method 200 may include generating a plasma of the third precursor prior to or after providing the third precursor to the semiconductor processing chamber. The third precursor may have at least one reactive group that can form bonds with unreacted reactive groups of the second precursor that formed the first metal oxide material 325. Molecules of the third precursor may react with the unreacted reactive groups of the second precursor to form bonds linking molecules of the third precursor to molecules of the second precursor 320. The reactions between molecules of the third precursor and molecules of the second precursor 320 may continue until most or all the unreacted reactive groups on molecules of the second precursor 320 have reacted with molecules of the third precursor. A first portion of a second metal oxide material may be formed at operation 230. The formation of the first portion of the second metal oxide material may block further reaction between molecules of the third precursor in the third precursor effluent and the first metal oxide material 325.

The formation rate of the first portion of the second metal oxide material may also depend on the pressure of the third precursor effluent in the substrate processing region. Exemplary effluent pressures in the substrate processing region may range from about 1 Torr to about 20 Torr. Additional exemplary ranges include 1 Torr to 15 Torr, and 1 Torr to 12 Torr, among other exemplary ranges.

Method 200 also includes an operation to purge or remove the third precursor effluents from the substrate processing region following the formation of the first portion of the second metal oxide material. The method 200 may include halting a flow of the third precursor prior to pursing the effluents of the second precursor. The effluents of the third precursor may be removed by pumping them out of the substrate processing region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include helium and nitrogen, among other purge gases.

After the removal of the third precursor effluents, a fourth precursor may be provided to the semiconductor processing chamber at operation 235. In embodiments, the method 200 may include generating a plasma of the fourth precursor prior to or after providing the fourth precursor to the semiconductor processing chamber. The fourth precursor may have at least one reactive group that can form bonds with unreacted reactive groups of the third precursor that formed the first portion of the second metal oxide material. Molecules of the fourth precursor may react with the unreacted reactive groups of the third precursor to form bonds linking molecules of the fourth precursor to molecules of the third precursor. The reactions between molecules of the fourth precursor and molecules of the third precursor may continue until most or all the unreacted reactive groups on molecules of the third precursor have reacted with molecules of the fourth precursor. The contact between the fourth precursor and the first portion of the second metal oxide material may form a second metal oxide material at operation 240. The formation of the second metal oxide material may block further reaction between molecules of the fourth precursor in the fourth precursor effluent and the second portion of the second metal oxide material. The third precursor, the fourth precursor, or both may include oxygen, such that the second metal oxide material may include oxygen. Accordingly, the effluents of the fourth precursor, together with the first portion of the second metal oxide material, may form a second metal oxide material. For example, the third precursor may include a first metal and the fourth precursor may include oxygen, with or without a second metal. The third precursor may form a layer of metal, and the fourth precursor may contact the layer of metal, forming the second metal oxide material.

The formation rate of the second metal oxide material may also depend on the pressure of the fourth precursor effluent in the substrate processing region. Exemplary effluent pressures in the substrate processing region may range from about 1 Torr to about 20 Torr. Additional exemplary ranges include 1 Torr to 15 Torr, and 1 Torr to 12 Torr, among other exemplary ranges.

Method 200 also includes an operation to purge or remove the fourth precursor effluents from the substrate processing region following the formation of the second portion of the second metal oxide material. The method 200 may include halting a flow of the fourth precursor prior to pursing the effluents of the fourth precursor. The effluents of the fourth precursor may be removed by pumping them out of the substrate processing region for a period of time ranging from about 10 seconds to about 100 seconds. Additional exemplary time ranges may include about 20 seconds to about 50 seconds, and 25 seconds to about 45 seconds, among other exemplary time ranges. In some embodiments, a purge gas may be introduced to the substrate processing region to assist in the removal of the effluents. Exemplary purge gases include helium and nitrogen, among other purge gases.

In embodiments, the method 200 may include using precursors including nitrogen. For example, any of the first, second, third, fourth, or additional precursors, if present, may include nitrogen. In such embodiments, the material deposited may include a metal nitride or a metal oxynitride material, which may include one or more metals, as previously discussed.

Similar to the first metal oxide material, there may be a determination of whether a target thickness of as-deposited second metal oxide material on the substrate 305 has been achieved following one or more cycles of forming the second metal oxide material. If a target thickness of the second metal oxide material has not been achieved, another cycle of forming the first portion of the second metal oxide material and forming the second metal oxide material may be performed. If a target thickness of the second metal oxide material has been achieved, another cycle may not be started. Exemplary numbers of cycles for the formation of the second metal oxide material may include 1 cycle, or may include greater than 2 cycles, 5 cycles, 10 cycles, 25 cycles, 50 cycles, 100 cycles, or more. Additional exemplary ranges for the number of cycles may include 50 cycles to 2000 cycles, 50 cycles to 1000 cycles, and 100 cycles to 750 cycles, among other exemplary ranges. Exemplary ranges of target thickness to discontinue further cycles of forming the second metal oxide material include about 1 Å to about 500 Å. Additional exemplary thickness ranges may include about 2 Å to about 300 Å, and 3 Å to about 200 Å, among other exemplary thickness ranges.

In embodiments, the as-deposited material on the substrate 305 may be annealed. Exemplary annealing may involve a thermal anneal of the as-deposited material. The as-deposited material may be deposited as an amorphous material, and the annealing may cause the amorphous material to at least partially transition to a crystalline material. Exemplary temperature ranges for the thermal anneal may include about 100° C. to about 600° C. Additional exemplary temperature ranges may include about 200° C. to about 500° C., and about 300° C. to about 450° C., among other temperature ranges. Exemplary times for the thermal anneal may include ranges of about 1 minute to about 120 minutes, about 10 minutes to about 60 minutes, and about 20 minutes to about 40 minutes, among other exemplary time ranges.

In some embodiments, method 200 may include optional treatment operations, such as a pretreatment, that may be performed to prepare a surface of a substrate 305 for deposition. For example, the substrate surface may be exposed to one or more of a chemical etchant, heat treatment, plasma, or passivation gas before introducing the pretreated substrate 305 to the first precursor.

The embodiments of the present disclosure may allow for the deposition of metal oxide materials without the presence of interfacial layers between the material and the substrate 305 or underlying material that the metal oxide material is formed on. By carefully selecting oxygen-containing precursors, and optionally switching the oxygen-containing precursor during formation, the metal oxide material may be characterized by desirable dielectric constants. For example, the dielectric constant may be greater than or about 3, and may be greater than or about 4, greater than or about 5, greater than or about 6, greater than or about 7, greater than or about 8, greater than or about 9, greater than or about 10, greater than or about 15, greater than or about greater than or about 25, greater than or about 30, greater than or about 35, greater than or about 40, or more. The high dielectric constant materials may protect underlying substrates or layers that may be sensitive to oxygen and/or moisture.

The embodiments of the present disclosure may have wide applicability. For example, the embodiments and materials previously described may improve the stability of quantum dots, especially blue quantum dots. The embodiments may improve the stability of perovskite solar cells via atomic layer deposition of a transparent metal oxide material. The embodiments may be used as oxidation barriers on carbon-containing structures (e.g., graphene, carbon nanotubes, etc.) and sulfide-containing films (e.g., $MoS_2$, $WS_2$, etc.). The embodiments may be used as environmental barriers on synthetic polymers, plastics, and pharmaceutical powders.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursor, and reference to "the material" includes reference to one or more materials and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
   providing a first precursor to a semiconductor processing chamber, wherein a substrate is disposed within a processing region of the semiconductor processing chamber, and wherein the first precursor comprises a first metal;
   contacting the substrate with the first precursor, wherein the contacting forms a first portion of a metal oxide material on the substrate;
   providing a second precursor to a semiconductor processing chamber, wherein the second precursor is an oxygen-containing precursor comprising an alkoxide, a hydroxide, an acetylacetonate, an acetate, a formate, a nitrate, a sulfate, a phosphate, a phosphide, a carbonate, an oxynitride, a perchlorate, an oxyhalide, an oxalate, or a phenolate; and
   contacting the first portion of a metal oxide material with the second precursor, wherein the contacting forms a metal oxide material on the substrate.

2. The semiconductor processing method of claim 1, wherein the first metal comprises a metal halide, a metal alkyl, a metal ethoxide, a metal sulfide, a metal cyclopentadienyl, a metal amide, a metal phosphine, a metal amine, a metal hydride, a metal carboxylate, a metal hydrazide, or a metal azide.

3. The semiconductor processing method of claim 1, wherein the second precursor further comprises a second metal, wherein the second metal is a different metal than the first metal.

4. The semiconductor processing method of claim 1, wherein the metal oxide material comprises two or more metals.

5. The semiconductor processing method of claim 1, wherein the oxygen-containing precursor does not include water, steam, ozone, molecular oxygen, oxygen-containing plasma, or hydrogen peroxide.

6. The semiconductor processing method of claim 1, wherein the metal oxide material is characterized by a dielectric constant of greater than or about 3.

7. The semiconductor processing method of claim 1, further comprising:

halting a flow of the first precursor while providing the second precursor.

8. The semiconductor processing method of claim 1, wherein the metal oxide material comprises a first metal oxide material, and wherein the oxygen-containing precursor comprises a first oxygen-containing precursor, the method further comprising:

subsequent to forming the metal oxide material to a first thickness, providing a third precursor to the semiconductor processing chamber;

contacting the first metal oxide material with the third precursor, wherein the contacting forms a first portion of a second metal oxide material on the first metal oxide material;

providing a fourth precursor to the semiconductor processing chamber, wherein the fourth precursor is a second oxygen-containing precursor; and contacting the first portion of the second metal oxide material with the fourth precursor, wherein the contacting forms a second metal oxide material on the first metal oxide material.

9. The semiconductor processing method of claim 8, wherein the fourth precursor comprises water, steam, ozone, molecular oxygen, oxygen-containing plasma, or hydrogen peroxide.

10. A semiconductor processing method comprising:

i) providing a first precursor, wherein the first precursor comprises a first metal;

ii) forming a first portion of a metal oxide material on a substrate;

iii) providing a second precursor, wherein the second precursor comprises a second metal different from the first metal; and iv) contacting the first portion of the metal oxide material with the second precursor, wherein the first precursor, the second precursor, or both further comprise oxygen, and wherein the contacting forms a metal oxide material.

11. The semiconductor processing method of claim 10, wherein operations i) through iv) are repeated for at least 2 cycles.

12. The semiconductor processing method of claim 10, wherein the metal oxide material is doped with one or more of aluminum, barium, calcium, hafnium, potassium, tantalum, titanium, sodium, strontium, zinc, or zirconium.

13. The semiconductor processing method of claim 10, further comprising:

annealing the metal oxide material, wherein the annealing causes amorphous metal oxide to crystallize.

14. The semiconductor processing method of claim 10, wherein the metal oxide material is a first metal oxide material, the method further comprising:

v) providing a third precursor, wherein the third precursor comprises a third metal;

vi) forming a first portion of a second metal oxide material on the first metal oxide material;

vii) providing a fourth precursor, wherein the fourth precursor comprises a fourth metal; and viii) contacting the first portion of the second metal oxide material with the fourth precursor, wherein the third precursor, the fourth precursor, or both further comprise oxygen, and wherein the contacting forms a second metal oxide material.

15. The semiconductor processing method of claim 14, wherein:

the first precursor, the second precursor, or both comprise a first oxygen-containing material; and the third precursor, the fourth precursor, or both comprise a second oxygen-containing material different than the first oxygen-containing material.

16. The semiconductor processing method of claim 10, wherein the first precursor, the second precursor, or both further comprise an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate.

17. The semiconductor processing method of claim 10, wherein the metal oxide material directly contacts the substrate.

18. A semiconductor processing method comprising:

providing a first precursor to a semiconductor processing chamber, wherein a substrate is disposed within a processing region of the semiconductor processing chamber, and wherein the first precursor comprises a first metal;

contacting the substrate with the first precursor, wherein the contacting forms a first portion of a metal oxide material on the substrate;

halting a flow of the first precursor;

providing a second precursor to a semiconductor processing chamber, wherein the second precursor comprises a second metal different than the first metal; and contacting the first portion of the metal oxide material with the second precursor, wherein the first precursor or the second precursor comprises an alcohol, an alkoxide, a hydroxide, an acetylacetonate, an acetate, a formate, a nitrate, a sulfate, a phosphate, a phosphide, a carbonate, an oxide, an oxynitride, a perchlorate, an oxyhalide, a peroxide, an oxalate, or a phenolate, wherein the contacting forms a metal oxide material on the substrate, wherein the metal oxide material directly contacts the substrate, and wherein the first precursor and the second precursor do not include water, steam, ozone, molecular oxygen, oxygen-containing plasma, or hydrogen peroxide.

19. The semiconductor processing method of claim 18, wherein no interfacial layer is formed between the substrate and the metal oxide material.

20. The semiconductor processing method of claim 18, wherein the metal oxide material comprises a plurality of metals.

* * * * *